United States Patent [19]
Nam et al.

[11] Patent Number: 5,902,102
[45] Date of Patent: May 11, 1999

[54] DIFFUSION FURNACE USED FOR SEMICONDUCTOR DEVICE MANUFACTURING PROCESS

[75] Inventors: Ki-hum Nam; O-yeon Han, both of Suwon, Rep. of Korea

[73] Assignee: Samsung Electronics Co., Ltd., Suwon, Rep. of Korea

[21] Appl. No.: 08/840,238

[22] Filed: Apr. 11, 1997

[30]     Foreign Application Priority Data

Apr. 16, 1996 [KR] Rep. of Korea ....................... 96-11448

[51] Int. Cl.⁶ ....................................................... F27B 9/04
[52] U.S. Cl. .......................... 432/152; 432/241; 118/715; 118/724; 118/725
[58] Field of Search .................................... 432/152, 241, 432/205; 118/724, 725, 715

[56] References Cited

U.S. PATENT DOCUMENTS 5,522,934  6/1996  Suzuki et al. ..................... 118/723 AN
5,622,566  4/1997  Hosaka et al. .................... 118/723 VE Primary Examiner—Teresa Walberg
Assistant Examiner—Jiping Lu
Attorney, Agent, or Firm—Jones, Volentine, Steinberg & Whitt, L.L.P.

[57] ABSTRACT

A furnace used for a semiconductor manufacturing process includes an injector that can be formed as either two or more divided tubes, having a straight-line form with each of the tubes having different lengths and open ends, or by one straight injector having a closed end and a plurality of nozzles spaced along a length of the injector. Accordingly, the furnace can easily be cleaned and handled, and a reaction gas can be uniformly distributed in the processing tube.

2 Claims, 3 Drawing Sheets

DIFFUSION FURNACE USED FOR SEMICONDUCTOR DEVICE MANUFACTURING PROCESS

BACKGROUND OF THE INVENTION

1. Field of the Invention

The present invention relates to a diffusion furnace used for a semiconductor manufacturing process, and more particularly, to a diffusion furnace having an injector for uniformly supplying a reaction gas into a processing tube.

2. Description of the Related Art

In order to increase the number of chips capable of being produced from a wafer, to thereby reduce the manufacturing costs of a semiconductor device and increase production, the diameter of the wafer is enlarged. Accordingly, an apparatus for manufacturing a semiconductor device must be adapted to the new larger diameter wafer. One such apparatus is a diffusion furnace. In a diffusion furnace, process steps involving silicon oxidation, heat treatment and deposition of impurities are performed. As the diameter of the wafer increases, vertical diffusion furnaces are used more, as opposed to horizontal diffusion furnace.

Referring to the conventional vertical diffusion furnace shown in FIG. 1, the furnace includes a processing tube 1 where a wafer is loaded for performing diffusion, a gas supply conduit 3 for supplying a reaction gas to the processing tube 1, and first and second fuzzy gas supply conduits 9 and 11 for supplying nitrogen gas. The fuzzy gas cleans the inside of the processing tube 1 and reduces the generation of contamination particles.

At one end of the reaction gas supply conduit 3, a U-shaped injector 5 is installed for uniformly supplying a reaction gas to the processing tube 1. On the side of the injector 5, a plurality of fine nozzles 7 are formed at regular intervals for injecting the reaction gas into the processing tube 1.

In order for the gas to react uniformly on the entire surface of the wafer during diffusion in the furnace, the reaction gas supplied through the injector 5 should be uniformly distributed in the processing tube 1. Accordingly, the nozzles 7 formed on the injector 5 should be clean and the openings of the nozzles 7 should be uniformly maintained.

However, since the nozzles 7 are very small, careless finishing processes cause nonuniform nozzle sizes. Also, part of the nozzles 7 can be clogged due to remaining gas or nonuniform pressure of the suppled reaction gas. As a result, the density of the diffused reaction gas on each portion of the wafer is non-uniform, which may occur more frequently as the diameter of the wafer becomes larger.

Even though the injector 5 and nozzles 7 are cleaned by chemicals, the clogging problem still persists because the U-shape of the injector and the small size of the nozzles prevent complete cleaning. Moreover, the U-shaped injector 5 has a complex structure and is fragile.

SUMMARY OF THE INVENTION

Accordingly, it is an object of the present invention to provide a diffusion furnace comprising an injector having a simple structure which is easy to handle and which uniformly supplies a reaction gas to a processing tube.

To accomplish these and other objects of the present invention, there is provided a diffusion furnace used for a semiconductor device manufacturing process comprising: a processing tube; a fuzzy gas supply conduit connected to the processing tube for supplying fuzzy gas to the processing tube; a reaction gas supply conduit for supplying a reaction gas to the processing tube for diffusion; and a plurality of linearly extending injectors installed in the processing tube and connected to one end of the reaction gas supply conduit, each of the injectors having a different length and open ends.

In another aspect of the invention there is also provided a diffusion furnace comprising: a processing tube; a fuzzy gas supply conduit connected to the processing tube for supplying fuzzy gas to the processing tube; a reaction gas supply conduit for supplying a reaction gas to the processing tube for diffusion; and an injector installed in the processing tube and connected to one end of the reaction gas supply conduit, the injector having a closed end and a plurality of nozzles spaced at regular intervals along a length thereof, and the injector linearly extending along a wall of the processing tube.

According to the injector of the present invention, a reaction gas can be uniformly injected into a processing tube, and the injector can be easily cleaned, preserved and handled.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Embodiment 1

Figure 2:
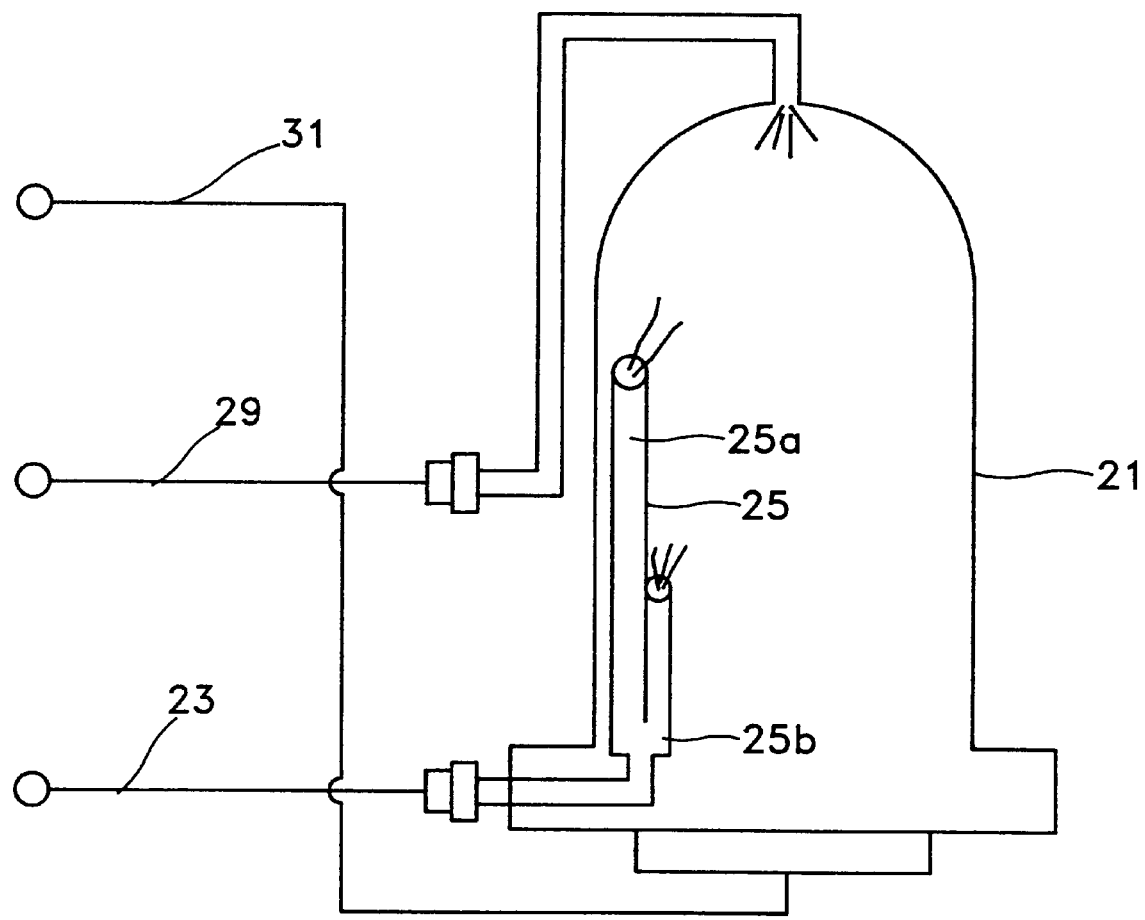
FIG. 2 is a sectional view of a diffusion furnace according to a first embodiment of the present invention.

Referring to FIG. 2, a furnace according to a first embodiment of the present invention includes a processing tube 21 and a reaction gas supply conduit 23 for supplying a reaction gas. A first fuzzy gas supply conduit 29 supplies a fuzzy gas for cleaning, for example, nitrogen gas, into the processing tube 21. A second fuzzy gas supply conduit 31 supplies a fuzzy gas to the processing tube 21 for helping the motion of a rotation unit for rotating a boat (not shown) having a wafer placed thereon, and for reducing the generation of contamination.

At one end of the reaction gas supply conduit 23, an injector 25 is installed for uniformly supplying the reaction gas to the processing tube 21. The injector 25 in the processing tube 21 is divided into a straight first injecting tube 25A and a straight second injecting tube 25B, each having an open end. Here, the length of the first injector 25A is longer than that of the second injector 25B. Since the reaction gas is supplied through the injector 25, which is divided into two tubes 25A and 25B each having a different length, the reaction gas can be uniformly supplied within the processing tube 21.

According to the first embodiment, the injector 25 is divided into two tubes. However, the injector 25 can be divided into three or more tubes having different lengths. The more tubes the injector 25 is divided into, the higher the uniformity of the reaction gas supplied to the processing tube 21.

Also, since fine nozzles are not formed along the injector 25, the conventional problem of a non-uniform gas supply due to the clogged nozzles is overcome. Further, the injector can easily be cleaned and it has a simple structure which can easily be handled or preserved.

Embodiment 2

Figure 1:
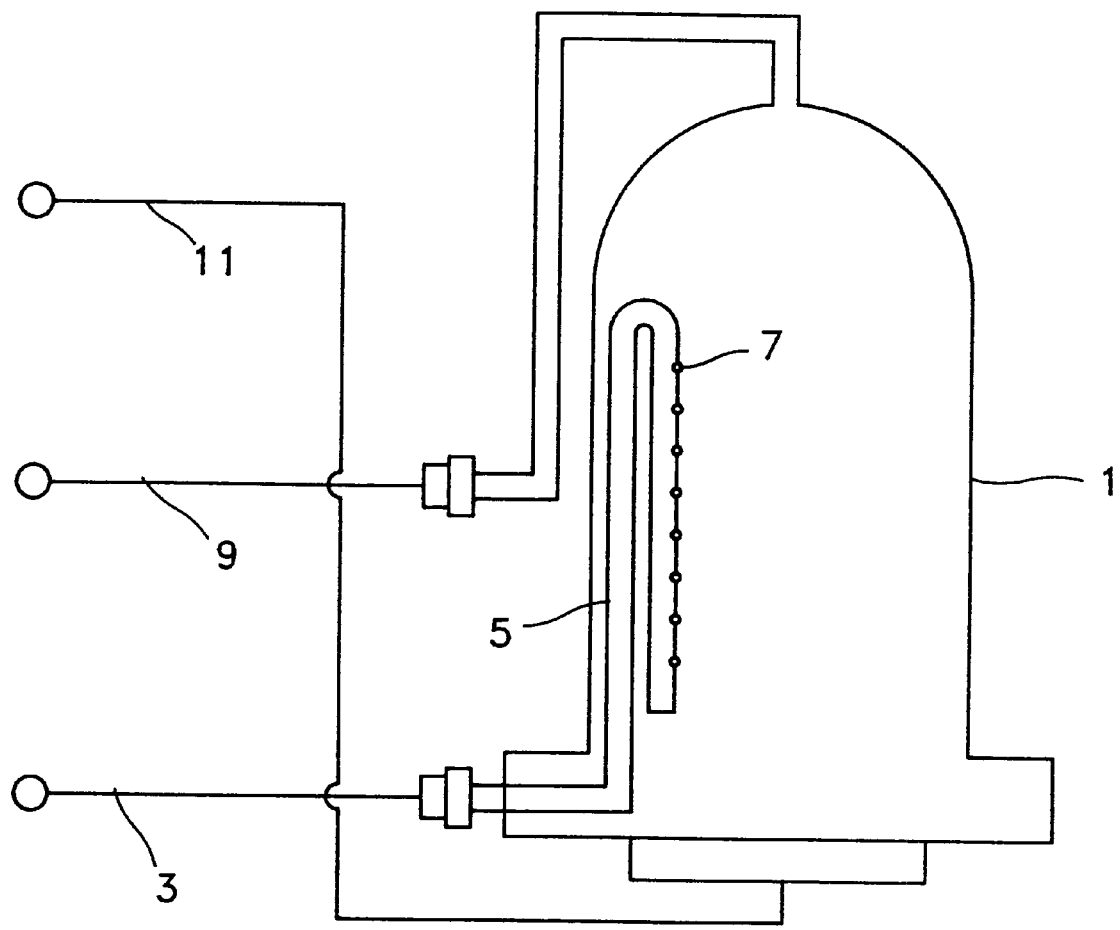
FIG. 1 is a sectional view of a conventional diffusion furnace.
Figure 3:
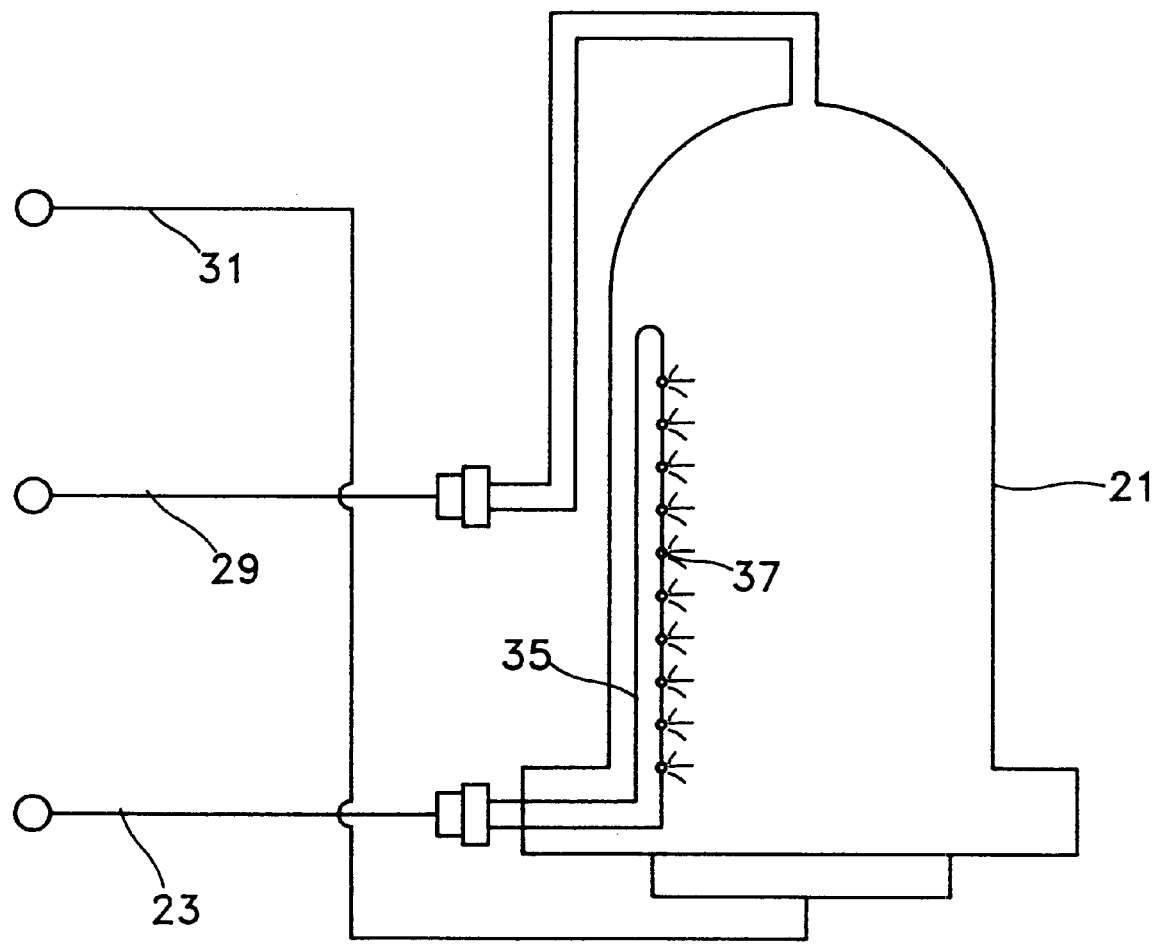
FIG. 3 is a sectional view of a diffusion furnace according to a second embodiment of the present invention.

Referring to FIG. 3, the furnace according to a second embodiment of the present invention includes an injector 35 having a straight-line form that is different from that of the injector in the first embodiment (see FIG. 2), and from the conventional U-shaped injector 5 as in FIG. 1. In FIG. 3, the same reference numerals refer to the same or like parts as previously described with reference to FIG. 2.

Specifically, the second injector 35 has a straight-line form that extends upward along one wall of the processing tube 21. The injector 35 also has a plurality of nozzles 37 spaced at regular intervals along the length thereof. Here, the diameter of the nozzles 37 is larger than that of the conventional nozzles 7 in FIG. 1. Therefore, the nozzles 37 will not get clogged and a uniform supply of reaction gas will be distributed in the processing tube 21.

In the second embodiment, the reaction gas is supplied to the processing tube 21 through the nozzles 37. The nozzles 37 can also be cleaned using chemicals. In addition, the injector 35 has a simple structure that can easily be preserved or handled.

It will be apparent to those skilled in the art that various modifications and variations can be made in the system and method of the present invention without departing from the spirit or scope of the invention. Thus, it is intended that the present invention cover the modifications and variations of this invention provided they come within the scope of the appended claims and their equivalents.

What is claimed is:

1. A batch type vertical diffusion furnace used for a semiconductor device manufacturing process comprising:

a processing tube having a container wherein a plurality of semiconductor wafers to be processed are arranged vertically at regular intervals;

a fuzzy gas supply conduit connected to said processing tube for supplying fuzzy gas to said processing tube;

a single reaction gas supply conduit entering the processing tube for supplying a reaction gas to said processing tube for diffusion; and a plurality of linearly upwardly extending injectors branching from one end of said reaction gas supply conduit within the processing tube and installed in said processing tube each of the injectors having a different length and open ends to supply a reaction gas uniformly through the injectors into the container.

2. The diffusion furnace of claim 1, wherein at least two fuzzy gas conduits are provided, each connected to the processing tube, one fuzzy gas conduit supplying a fuzzy gas for cleaning and the other fuzzy gas conduit supplying a fuzzy gas for facilitating rotation of the container.

* * * * *

UNITED STATES PATENT AND TRADEMARK OFFICE
CERTIFICATE OF CORRECTION

PATENT NO. : 5,902,102
APPLICATION NO. : 08/840238
DATED : May 11, 1999
INVENTOR(S) : Ki-hum Nam et al.

It is certified that error appears in the above-identified patent and that said Letters Patent is hereby corrected as shown below:

On Title Page item 56 should read

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | JP | 0 | 2 | 1 | 8 | 6 | 6 2 8 | 07/20/90 | Japan | | | | |
| | JP | 0 | 5 | 2 | 2 | 6 | 2 6 3 | 09/03/93 | Japan | | | | |
| | | | | | | | | | | | | | |
| | | | | | | | | | | | | | |

Signed and Sealed this

Third Day of June, 2008

JON W. DUDAS
*Director of the United States Patent and Trademark Office*